United States Patent
Yuasa et al.

(10) Patent No.: US 12,109,640 B2
(45) Date of Patent: Oct. 8, 2024

(54) CERAMIC-COPPER COMPOSITE, CERAMIC CIRCUIT BOARD, POWER MODULE, AND METHOD OF PRODUCING CERAMIC-COPPER COMPOSITE

(71) Applicant: DENKA COMPANY LIMITED, Tokyo (JP)

(72) Inventors: Akimasa Yuasa, Omuta (JP); Takahiro Nakamura, Omuta (JP); Koji Nishimura, Omuta (JP)

(73) Assignee: DENKA COMPANY LIMITED, Tokyo (JP)

( * ) Notice: Subject to any disclaimer, the term of this patent is extended or adjusted under 35 U.S.C. 154(b) by 568 days.

(21) Appl. No.: 17/418,888

(22) PCT Filed: Dec. 26, 2019

(86) PCT No.: PCT/JP2019/051108
§ 371 (c)(1),
(2) Date: Apr. 1, 2022

(87) PCT Pub. No.: WO2020/138283
PCT Pub. Date: Jul. 2, 2020

(65) Prior Publication Data
US 2022/0225498 A1    Jul. 14, 2022

(30) Foreign Application Priority Data
Dec. 28, 2018  (JP) ................. 2018-248175

(51) Int. Cl.
*B23K 1/00*   (2006.01)
*B22F 1/05*   (2022.01)
(Continued)

(52) U.S. Cl.
CPC .......... *B23K 1/0016* (2013.01); *C04B 37/023* (2013.01); *H01L 23/3735* (2013.01);
(Continued)

(58) Field of Classification Search
CPC ... B22F 1/05; B22F 7/04; B22F 9/082; B23K 1/0016; B23K 1/19; B23K 35/007;
(Continued)

(56) References Cited

U.S. PATENT DOCUMENTS

| 6,613,450 B2 | 9/2003 | Tsukaguchi et al. |
| 8,564,118 B2 | 10/2013 | Kuromitsu et al. |

(Continued)

FOREIGN PATENT DOCUMENTS

| CN | 102047413 A | 5/2011 |
| CN | 104885206 A | 9/2015 |

(Continued)

OTHER PUBLICATIONS

Jan. 21, 2022 Search Report issued in European Patent Application No. 19905496.6.
(Continued)

*Primary Examiner* — Kevin Ct Li
(74) *Attorney, Agent, or Firm* — Oliff PLC

(57) ABSTRACT

A ceramic-copper composite having a flat plate shape, including: a ceramic layer; a copper layer; and a brazing material layer present between the ceramic layer and the copper layer, in which a specified Expression (1) is satisfied in a cut surface of the copper layer obtained when the ceramic-copper composite is cut at a plane perpendicular to a main surface of the ceramic-copper composite, where S(102)% is an area ratio occupied by copper crystals having a crystal orientation of which an inclination from a crystal orientation of (102) plane is within 10°, S(101)% is an area ratio occupied by copper crystals having a crystal orientation of which an inclination from a crystal orientation of (101) plane is within 10°, S(111)% is an area ratio occupied by copper crystals having a crystal orientation of which an inclination from a crystal orientation of (111) plane is within
(Continued)

10°, and S(112)% is an area ratio occupied by copper crystals having a crystal orientation of which an inclination from a crystal orientation of (112) plane is within 10°.

11 Claims, 4 Drawing Sheets

(51) Int. Cl.
    *C04B 37/02*     (2006.01)
    *H01L 23/373*     (2006.01)
    *H05K 1/03*     (2006.01)
    *H05K 1/09*     (2006.01)
    *H05K 3/06*     (2006.01)
    *B23K 101/42*     (2006.01)
    *B23K 103/00*     (2006.01)
    *B23K 103/12*     (2006.01)

(52) U.S. Cl.
    CPC ............ *H05K 1/0306* (2013.01); *H05K 1/09* (2013.01); *H05K 3/06* (2013.01); *B22F 1/05* (2022.01); *B23K 2101/42* (2018.08); *B23K 2103/12* (2018.08); *B23K 2103/52* (2018.08); *C04B 2237/125* (2013.01); *C04B 2237/368* (2013.01); *C04B 2237/407* (2013.01); *C04B 2237/52* (2013.01); *H05K 2201/0355* (2013.01); *H05K 2203/1126* (2013.01)

(58) Field of Classification Search
    CPC ............ B23K 35/0233; B23K 35/0244; B23K 35/025; B23K 35/3006; B23K 35/3601; B23K 35/3613; B23K 35/383; B23K 2101/36; B23K 2101/42; B23K 2103/12; B23K 2103/18; B23K 2103/52; B32B 3/30; B32B 7/12; B32B 9/005; B32B 9/041; B32B 15/20; B32B 2307/732; B32B 2457/08; C04B 37/02; C04B 37/023; C04B 37/026; C04B 2235/6567; C04B 2235/6581; C04B 2235/343; C04B 2235/348; C04B 2235/365; C04B 2235/366; C04B 2235/407; C04B 2235/52; C22C 9/00; H01L 23/12; H01L 23/14; H01L 23/15; H01L 23/3755; H05K 1/0306; H05K 1/09; H05K 3/388; H05K 2201/0355; H05K 2303/1126
    See application file for complete search history.

(56) References Cited

U.S. PATENT DOCUMENTS

| | | | |
|---|---|---|---|
| 8,742,258 B2 | 6/2014 | Terashima et al. | |
| 8,921,996 B2 | 12/2014 | Kuromitsu et al. | |
| 9,642,275 B2 | 5/2017 | Ohashi et al. | |
| 10,016,956 B2 | 7/2018 | Terasaki et al. | |
| 2003/0068532 A1* | 4/2003 | Tsukaguchi | ........... C04B 35/581 |
| | | | 428/698 |
| 2011/0074010 A1 | 3/2011 | Kuromitsu et al. | |
| 2012/0118610 A1 | 5/2012 | Terashima et al. | |
| 2013/0306352 A2 | 11/2013 | Terashima et al. | |
| 2014/0015140 A1 | 1/2014 | Kuromitsu et al. | |
| 2015/0022977 A1 | 1/2015 | Kuromitsu et al. | |
| 2015/0319877 A1 | 11/2015 | Ohashi et al. | |
| 2016/0221305 A1* | 8/2016 | Terasaki | .................... B32B 7/12 |
| 2017/0229320 A1* | 8/2017 | Oohiraki | ................. C04B 37/02 |
| 2018/0090414 A1* | 3/2018 | Dan | ........................ B32B 18/00 |
| 2021/0176860 A1 | 6/2021 | Tsugawa et al. | |

FOREIGN PATENT DOCUMENTS

| | | | | |
|---|---|---|---|---|
| CN | 105023902 A | | 11/2015 | |
| EP | 3370488 A1 | | 9/2018 | |
| JP | 2003-112980 A | | 4/2003 | |
| JP | 2005-268821 A | | 9/2005 | |
| JP | 2013-234383 A | | 11/2013 | |
| JP | 2014090144 A | * | 5/2014 | |
| JP | 2015-092552 A | | 5/2015 | |
| JP | 2016-039163 A | | 3/2016 | |
| JP | 2016-115821 A | | 6/2016 | |
| JP | 2016-139680 A | | 8/2016 | |
| JP | 2017-075382 A | | 4/2017 | |
| JP | 2017-175061 A | | 9/2017 | |
| WO | WO-2012026611 A1 | * | 3/2012 | ............... C22C 1/02 |
| WO | 2018/221493 A1 | | 12/2018 | |

OTHER PUBLICATIONS

Mar. 10, 2020 International Search Report issued in International patent Application No. PCT/JP2019/051108.
Mar. 9, 2022 Office Action and Search Report issued in Chinese Patent Application No. 201980086356.2.

* cited by examiner ously increased in accordance with high power output or high integration of the power module. In order to efficiently dissipate the generated heat, a ceramic material such as an aluminum nitride sintered body or a silicon nitride sintered body having high insulation and high thermal conductivity tends to be used.

CERAMIC-COPPER COMPOSITE, CERAMIC CIRCUIT BOARD, POWER MODULE, AND METHOD OF PRODUCING CERAMIC-COPPER COMPOSITE

TECHNICAL FIELD

The present invention relates to a ceramic-copper composite, a ceramic circuit board, a power module, and a method of manufacturing the ceramic-copper composite.

BACKGROUND ART

In manufacturing a power module, a ceramic-metal composite obtained by bonding a metal plate with a ceramic material such as alumina, beryllia, silicon nitride, or aluminum nitride has been used.

Recently, an amount of heat generated from the power module has been steadily increased in accordance with high power output or high integration of the power module. In order to efficiently dissipate the generated heat, a ceramic material such as an aluminum nitride sintered body or a silicon nitride sintered body having high insulation and high thermal conductivity tends to be used.

As an example, Patent Document 1 discloses a metal-ceramic bonded body including a ceramic substrate and a metal plate bonded onto the ceramic substrate through a brazing material. In the bonded body, a length of the brazing material protruding from a bottom surface of the metal plate is more than 30 μm and 250 μm or less.

As another example, Patent Document 2 discloses a ceramic circuit board in which a brazing material layer is formed on at least one surface of a ceramic substrate along a plurality of circuit patterns, a metal plate is bonded through the brazing material layer, and an etching treatment is performed on an unnecessary part of the metal plate to form a circuit pattern made of the metal plate and to form a protruding portion by a brazing material layer protruded from an edge of the metal plate. In the ceramic circuit board, the maximum surface roughness Rmax of the protruding portion is 5 to 50 μm.

As still another example, Patent Document 3 discloses a Cu/ceramic bonded body in which a copper member made of copper or a copper alloy and a ceramic member made of AlN or Al$_2$O$_3$ are bonded using a bonding material containing Ag and Ti. In the bonded body, a Ti compound layer made of a Ti nitride or a Ti oxide is formed at a bonding interface between a copper member and a ceramic member, and Ag particles are dispersed in the Ti compound layer.

As still another example, Patent Document 4 discloses a method of manufacturing a power module substrate in which a metal plate which is blanked by press working is stacked on one surface of a ceramic substrate and bonded by brazing, in which a height of a burr of the metal plate, or the like is specified using the metal plate which is blanked by press working as a metal plate, and the metal plate and the ceramic substrate are stacked and brazed so that a surface on a side at which the burr is generated overlaps one surface of the ceramic substrate.

RELATED DOCUMENT

Patent Document

[Patent Document 1] Japanese Unexamined Patent Publication No. 2003-112980

[Patent Document 2] Japanese Unexamined Patent Publication No. 2005-268821

[Patent Document 3] Japanese Unexamined Patent Publication No. 2015-092552

[Patent Document 4] Japanese Unexamined Patent Publication No. 2016-039163

SUMMARY OF THE INVENTION

Technical Problem

However, even if the above technology is used, there is room for improvement in manufacturing stability and yield of the ceramic-metal composite, the ceramic circuit board, or the power module. In addition, one of the factors of reducing the yield of the ceramic-metal composite, the ceramic circuit board, or the power module is brazing material oozing, defects in solder wettability on the ceramic circuit board caused by the brazing material oozing, or defects in bonding of a semiconductor element.

The present invention has been made in view of such circumstances. The present invention is to improve the manufacturing stability and the yield of the ceramic-metal composite, the ceramic circuit board, or the power module first, and more specifically, to provide a ceramic-metal composite in which the bring material oozing, which is a factor of reducing the yield, is decreased. The brazing material oozing means a phenomenon in which a brazing material (usually, silver) used for bonding a ceramic substrate and a copper plate crawls up an end surface of the copper plate and is wrapped around the surface of the copper plate.

Solution to Problem

As a result of extensive studies, the present inventors have completed the inventions provided below and solved the above problems.

That is, according to the present invention, there is provided a ceramic-copper composite having a flat plate shape, including: a ceramic layer; a copper layer; and a brazing material layer present between the ceramic layer and the copper layer, in which the following Expression (1) is satisfied in a cut surface of the copper layer obtained when the ceramic-copper composite is cut at a plane perpendicular to a main surface of the ceramic-copper composite, where S(102)% is an area ratio occupied by copper crystals having a crystal orientation of which an inclination from a crystal orientation of (102) plane is within 10°, S(101)% is an area ratio occupied by copper crystals having a crystal orientation of which an inclination from a crystal orientation of (101) plane is within 10°, S(111)% is an area ratio occupied by copper crystals having a crystal orientation of which an inclination from a crystal orientation of (111) plane is within 10°, and S(112)% is an area ratio occupied by copper crystals having a crystal orientation of which an inclination from a crystal orientation of (112) plane is within 10°, $$S(102)+S(101)>S(111)+S(112). \quad \text{Expression (1)}$$

Further, according to the present invention, there is provided a ceramic circuit board in which at least a part of the copper layer is removed from the ceramic-copper composite and a circuit is formed.

Further, according to the present invention, there is provided a power module on which the ceramic circuit board is mounted.

According to the present invention, there is provided a method of producing a ceramic-copper composite including bonding a ceramic substrate and a copper plate through a brazing material, in which the copper plate satisfies the following Expression (1) in a cut surface obtained by cutting the ceramic-copper composite at a plane perpendicular to a main surface of the ceramic-copper composite, where S(102)% is an area ratio occupied by copper crystals having a crystal orientation of which an inclination from a crystal orientation of (102) plane is within 10°, S(101)% is an area ratio occupied by copper crystals having a crystal orientation of which an inclination from a crystal orientation of (101) plane is within 10°, S(111)% is area ratio occupied by copper crystals having a crystal orientation of which an inclination from a crystal orientation of (111) plane is within 10°, and S(112)% is an area ratio occupied by copper crystals having a crystal orientation of which an inclination from a crystal orientation of (112) plane is within 10°, $$S(102)+S(101)>S(111)+S(112). \quad \text{Expression (1)}$$

Advantageous Effects of Invention

According to the present invention, it is possible to provide a ceramic-metal composite a ceramic circuit board, a power module which are capable of decreasing oozing of the brazing material, and a method of producing the ceramic-copper composite capable of decreasing the oozing of the brazing material.

BRIEF DESCRIPTION OF THE DRAWINGS

The above-described and other objects, advantages, and features of the present invention will be more apparent from the preferred embodiments described below, and the accompanying drawings.

FIG. 1 includes views schematically illustrating a ceramic-copper composite of the present embodiment.

DESCRIPTION OF EMBODIMENTS

Hereinafter, an embodiment of the present invention will be described in detail with reference to the drawings.

In all drawings, the same constituent components are denoted by the same reference signs, and detailed explanation thereof will not be repeated.

Figure 1A:
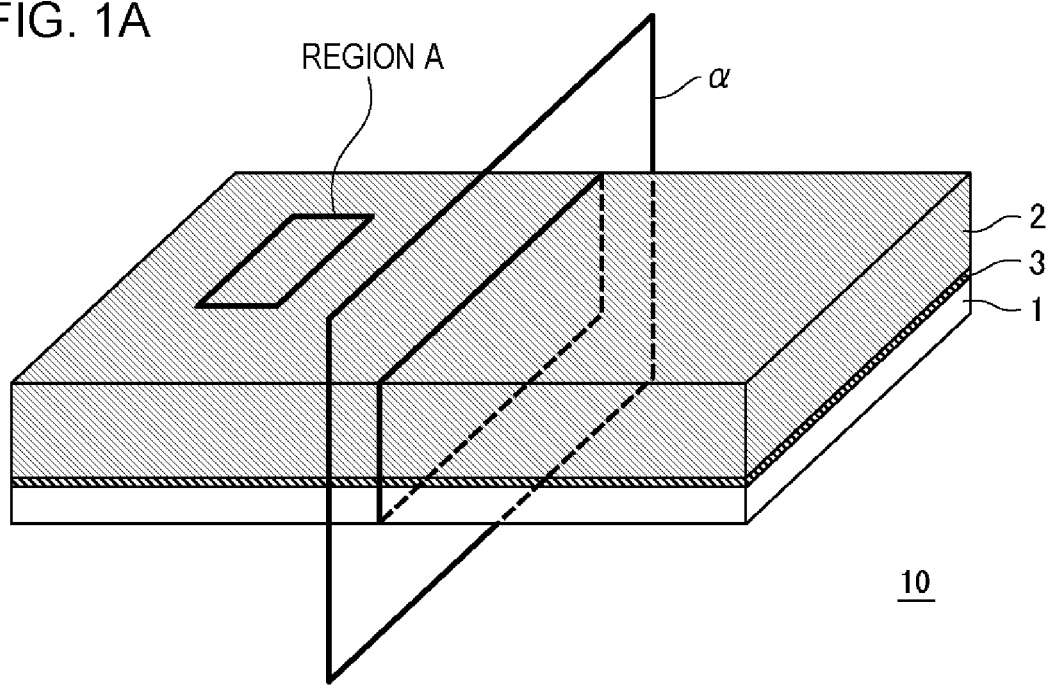
FIG. 1A is a perspective view schematically illustrating the entire ceramic-copper composite.
Figure 1B:
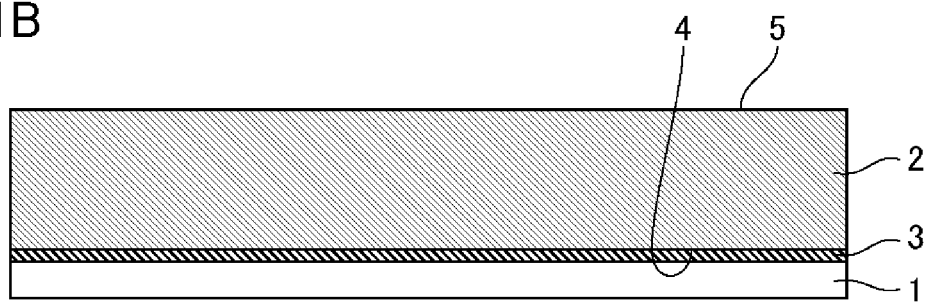
FIG. 1B is a view schematically illustrating a cross section of the ceramic-copper composite.
Figure 2:
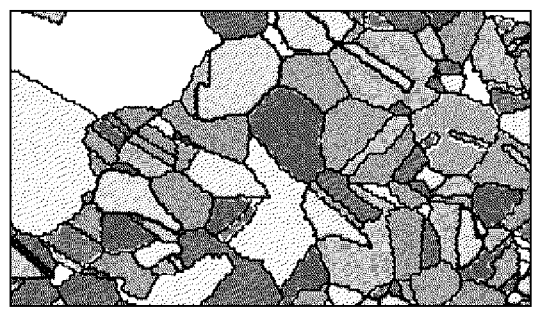
FIG. 2 is a crystal orientation map of a cut surface of a copper layer of the ceramic-copper composite according to the present embodiment.

In order to avoid complexity, (i) in a case where there is a plurality of the same components in the same drawing, only one of the components is denoted by a reference sign, and all the components are not denoted by reference signs, or (ii) for example, in FIG. 2 and subsequent drawings, the same components as those in FIGS. 1A and 1B may not be denoted by reference signs again.

All drawings are for illustration purposes only. The shapes, dimensional ratios, and the like of each part in the draws do not necessarily correspond to actual articles. For example, vertical and horizontal dimensions of each part illustrated in the drawings may be exaggerated in a vertical or horizontal direction.

<Ceramic-Copper Composite>

FIG. 1A is a perspective view schematically illustrating a ceramic-copper composite (composite) 10 of the present embodiment.

The ceramic-copper composite 10 has a flat plate shape.

The ceramic-copper composite 10 includes at least a ceramic layer 1, a copper layer 2, and a brazing material layer 3 present between these two layers. In other words, the ceramic layer 1 and the copper layer 2 are bonded by the brazing material layer 3.

FIG. 1B is a view schematically illustrating a cut surface of the ceramic-copper composite 10 illustrated in FIG. 1A obtained when the ceramic-copper composite is cut at a plane α perpendicular to a main surface thereof. The cut surface of the copper layer 2 may be the cut surface when cut at the cut plane α. The cut plane α can be set so as to pass through the center of gravity of the flat plate-shaped composite, for example. In addition, when the copper layer 2 is formed of a rolled copper plate, the cut plane α may be directed perpendicular to a copper plate rolling direction.

The ceramic-copper composite 10 according to the present embodiment satisfies the following Expression (1) in a cut surface of the copper layer 2 obtained when the ceramic-copper composite 10 is cut at a plane perpendicular to a main surface of the ceramic-copper composite 10, where S(102)% is an area ratio occupied by copper crystals having a crystal orientation of which an inclination from a crystal orientation of (102) plane is within 10%, S(101)% is an area ratio occupied by copper crystals having a crystal orientation of which an inclination from a crystal orientation of (101) plane is within 10%, S(111)% is an area ratio occupied by copper crystals having a crystal orientation of which an inclination from a crystal orientation of (111) plane is within 10°, and S(112)% is an area ratio occupied by copper crystals having a crystal orientation of which an inclination from a crystal orientation of (112) plane is within 10°.

$$S(102)+S(101)>S(111)+S(112). \quad \text{Expression (1)}$$

The reason why the ceramic-metal composite 10 improves a yield of the ceramic-metal composite 10, the ceramic circuit board, or the power module is not clear. However, as a result of the intensive studies, the present inventors find that she yield is improved when the crystal orientations of the copper layer 2 are controlled in specific forms in the ceramic-metal composite 10, thereby completing the present embodiment. According to the studies by the present inventors, one of factors of reducing the yield is occurrence of brazing material oozing. According to the ceramic-metal composite of the present embodiment, since the occurrence of the brazing material oozing can be decreased, it is considered that manufacturing stability and yield of the obtained ceramic-metal composite 10, ceramic circuit board, and power module are improved. Further, according to the assumption of the present inventors, by controlling the area ratio occupied by the copper crystals having each crystal orientation to satisfy specific conditions in the cut surface of the copper layer 2 obtained when the ceramic-metal composite 10 is cut at a plane perpendicular to the main surface of the ceramic-metal composite 10, growth of copper crystal particles in the copper layer 2 can be decreased. Since an amount of the brazing material diffused into the copper layer 2 increases, the brazing material oozes from an end portion of the copper layer 2 and crawls up the end surface of the copper layer 2, and the amount of the brazing material oozing out of an upper surface of the copper layer 2 and a frequency thereof can thus be reduced. Therefore, it is considered that defects related to the oozing in the obtained ceramic-metal composite 10, ceramic circuit board, or power module are reduced, and the yield is improved.

Note that the above description includes assumptions, and the above description is not within the scope of the present invention.

In order for the area of the copper crystals having each crystal orientation to satisfy Expression (1) in the cut surface of the copper layer 2, it is important to select an appropriate material in manufacturing of the ceramic-copper composite 10 and appropriately adjust manufacturing conditions of the ceramic-copper composite 10. Details thereof will be described later.

<Calculation Method of Area Ratio (%) of Copper Crystals Having Each Crystal Orientation>

A method of measuring an area ratio (%) of copper crystals having each crystal orientation in the cut surface of the copper layer 2 obtained when the ceramic-copper composite 10 of the present embodiment is cut at a plane perpendicular to the main surface of the ceramic-copper composite 10 will be described.

(Preparation of Sample)

First, for example, a "cut surface" for measuring the area ratio (%) of copper crystals having each crystal orientation is obtained as follows.

(i) The ceramic-copper composite 10 (or ceramic circuit board to be described later) is cut, by a contour machine, at the main surface and a plane perpendicular to a rolling direction of the copper plate, to expose the cut surface of the ceramic-copper composite 10. Here, the cut surface may be a surface that passes through the center of gravity of the ceramic-copper composite 10.

(ii) The cut ceramic-copper composite 10 was embedded in a resin to prepare a resin-embedded body.

(iii) Buff polishing is performed on a cross section of the ceramic-copper composite 10 in the prepared resin embedded body with diamond abrasive grains.

(iv) The polished surface of the ceramic-copper composite 10 is subjected to a flat milling treatment by Ar milling.

(Acquisition of Diffraction Pattern by EBSD Method)

In the polished cross section of the ceramic-copper composite 10, an area ratio (%) of the copper crystals having each crystal orientation in the copper layer 2 on the cut surface of the ceramic-copper composite 10 is calculated using a diffraction pattern obtained by an electron back scattering diffraction (EBSD) method.

According to this method, by irradiating a sample with an electron beam, electron backscatter diffraction is generated on a crystal plane having each crystal orientation existing on a surface layer of the sample, and the generated diffraction pattern is analyzed, such that a crystal orientation of copper crystals existing on the surface of the sample can be analyzed.

Analysis conditions can be as follows, for example.
Device: SU6600 Type field-emission scanning electron microscopy (manufactured by Hitachi High-Tech Corporation), EBSD (manufactured by TSL solutions)
Acceleration voltage: 15 kV
Field of view: 800 μm×300 μm An analysis part can be the cut surface of the ceramic-copper composite 10 and an arbitrary region in the copper layer 2. In this case, copper crystals having the same crystal orientation are given the same color. In the analysis, for example, a crystal plane having a crystal orientation of which an inclination from a crystal orientation of (100) plane is within 10° is regarded as a (100) plane, and the crystal plane having a crystal orientation of which an inclination from the crystal orientation of the (100) plane is within 10° can be included in the (100) plane.

By the above method, a crystal orientation map in which a color of the copper crystal grains is divided by the crystal orientation of the copper crystals is created for the analyzed regions (for example, FIG. 2). When an area of the analyzed region is 100%, the area ratio occupied by copper crystals having each crystal orientation is calculated using the crystal orientation map.

As described above, the ceramic-copper composite 10 according to the present embodiment satisfies the following Expression (1) in a cross section of the copper layer 2 obtained when the ceramic-copper composite 10 is cut at a plane perpendicular to a main surface of the ceramic-copper composite 10, where $S(102)\%$ is an area ratio occupied by copper crystals having a crystal orientation of which an inclination from a crystal orientation of (102) plane is within 10°, $S(101)\%$ is an area ratio occupied by copper crystals having a crystal orientation of which an inclination from a crystal orientation of (101) plane is within 10°, $S(111)\%$ is an area ratio occupied by copper crystals having a crystal orientation of which an inclination from a crystal orientation of (111) plane is within 10°, and $S(112)\%$ is an area ratio occupied by copper crystals having a crystal orientation of which an inclination from a crystal orientation of (112) plane is within 10°, $$S(102)+S(101)>S(111)+(112) \qquad \text{Expression (1)}$$

Further, $S(102)+S(101)$ is preferably 3% or more, more preferably 5% or more, and still more preferably 8% or more than $S(111)+S(112)$.

Further, $S(102)+S(101)$ is preferably 2% or more and 50% or less, more preferably 5% or more and 40% or less, and still more preferably 20% or more and 30% or less.

By setting $S(102)+S(101)$ within the above numerical range, it is considered that defects related to oozing in the obtained ceramic-metal composite, ceramic circuit board, and power module are further reduced, and the yield thereof is further improved.

$S(111)+S(112)$ is preferably 1% or more and 30% or less, more preferably 3% or more and 25% or less, and still more preferably 5% or more and less than 20%.

By setting $S(111)+S(112)$ within the above numerical range, it is considered that defects related to oozing in the obtained ceramic-metal composite, ceramic circuit board, and power module are further reduced, and the yield thereof is further improved.

For example, $S(102)$ is preferably 1% or more and 40% or less, more preferably 2% or more and 30% or less, and still more preferably 3% or more and 25% or less.

For example, $S(101)$ is preferably 1% or more and 40% or less, more preferably 2% or more and 30% or less, and still more preferably or more and 25% or less.

For example, $S(111)$ is preferably 0.1% or more and 25% or less, more preferably 0.5% or more and 20% or less, and still more preferably 1% or more and 10% or less.

For example, $S(112)$ is preferably 0.1% or more and 25% or less, more preferably 0.5% or more and 20% or less, and still more preferably 1% or more and 10% or less.

By setting the area ratio of each crystal orientation within the above numerical range, it is considered that the less brazing material oozing occurs.

Hereinafter, the ceramic layer 1, the copper layer 2, and the brazing material layer 3 present between the ceramic layer 1 and the copper layer 2 of the ceramic-copper composite 10 according to the present embodiment will be described in detail.

<Copper Layer>

The copper layer 2 of the ceramic-copper composite 10 according to the present embodiment is preferably formed of a rolled copper plate having a first surface 4 facing the ceramic layer 1 and a second surface 5 opposite to the first surface 4.

The copper plate is more preferably formed of oxygen-free copper (OFC) which is rolled with a large pressure.

By using the rolled copper plate, the brazing material oozing is decreased, and a stress alleviating effect when the thermal cycle test is carried out is further increased, such that it is considered that the ceramic-copper composite 10 having higher reliability is achieved.

For reference, an OFCG material (oxygen-free copper plate, produced by Mitsubishi Shindoh Co., Ltd.) is produced by a process including a rolling process.

According to the present embodiment, the rolled copper plate has the first surface 4 facing the ceramic layer 1 and the second surface 5 opposite to the first surface 4. In the second surface 5, an average crystal grain size of the copper crystals measured by an intercept method is preferably 250 µm or less, and preferably 200 µm or less. The lower limit of the average crystal grain size of the copper crystals is not limited, but can be, for example, 20 µm or more.

By adopting the average crystal grain size of the copper crystals measured by the intercept method in the embodiment, it is considered that defects related to oozing in the obtained ceramic-metal composite, ceramic circuit board, and power module are further reduced, and the yield thereof is further improved.

In the present embodiment, the average crystal grain size of the copper crystals is measured by an intercept method. Specifically, the intercept method is a method of observing the second surface 5 with SEM/EBSD at, for example, 50 magnification and drawing a plurality of straight lines having a predetermined length on the observed image in parallel to obtain an average value of lengths of the straight lines which cross the copper crystal particles as an average crystal grain size of the copper crystals. In the present embodiment, it is preferable to obtain the average crystal grain size of the copper crystals by drawing at least 10 or more straight lines.

An analysis part is an arbitrary part in the second surface 5, and may be, for example, the region A in FIG. 1A.

The rolled copper plate may contain a metal element other than Cu as an impurity. Specific examples of the metal element can include Ag and Al.

The rolled copper plate according to the present embodiment preferably has an Ag content of 5 ppm or more and 100 ppm or less, and more preferably 7 ppm or more and 50 ppm or less.

In addition, the rolled copper plate according to the present embodiment preferably has an Al content of 2.0 ppm or less, more preferably 1.0 ppm or less, and still more preferably 0.5 ppm or less.

In addition, the rolled copper plate according to the present embodiment preferably has a Mg content of 0.1 ppm or less, more preferably 0 ppm or a detection limit or less by the method described above in Examples.

A relationship between an amount of impurities contained in the rolled copper plate and the yield of the ceramic-copper composite 10 is not necessarily clear. However, by setting the amount of impurities within the numerical range, it is considered that the crystal orientation of the copper can be controlled, and furthermore, growth of the copper crystal particles can be decreased. Since the amount of the brazing material diffused into the copper layer 2 increases, it is considered that defects related to the brazing material oozing are further reduced, and the yield is further improved.

The amount of impurities contained in the rolled copper plate can be analyzed by ICP emission spectrometry. Specifically, the amount of impurities contained in the rolled copper plate can be obtained by cutting the rolled copper plate according to the present embodiment, cleaning the cut rolled copper plate with acetone and a mixed acid of hydrochloric acid and nitric acid, adding 5 ml of nitric acid to 1 g of the cleaned sample, and dissolving the mixture at a sand bath to measure the obtained solution using an ICP emission spectrometer (ICPE-9000, manufactured by Shimadzu Corporation) or the like.

Figure 4:
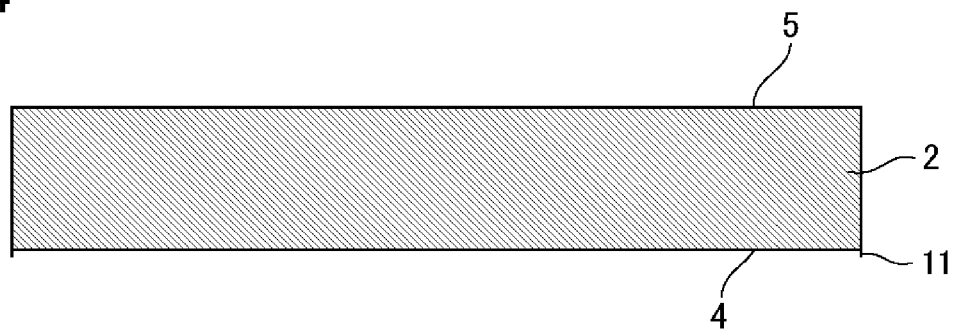
FIG. 4 is a cross-sectional view illustrating an example of a configuration of a rolled copper plate according to the present embodiment.

The rolled copper plate according to the present embodiment can be a rolled copper plate having a burr that protrudes toward the ceramic layer 1 on a part or the entire periphery of an outer edge portion of the first surface 4. FIG. 4 is a cross-sectional view illustrating an example of the configuration of the rolled copper plate, and illustrates a rolled substrate (copper layer 2) in which a burr 11 is provided on the outer edge portion of the first surface 4. In addition, the rolled copper plate according to the present embodiment may be a rolled copper plate that has a portion without the burr that protrudes toward the ceramic layer 1 on a part of the outer edge portion of the first surface 4 or has the burr that protrudes toward the ceramic layer 1 and have a height or 20 µm or less on the part of the outer edge portion of the first surface 4.

The rolled copper plate in the embodiment can be obtained by blanking by press working.

According to the present embodiment, even if the rolled copper plate having the shape of the embodiment is used, the defects related to the brazing material oozing can be further reduced and the yield can be further improved, thereby achieving the ceramic-copper composite 10 having high reliability.

<Brazing Material Layer>

The brazing material layer 3 according to the present embodiment preferably contains Ag, Cu and Ti, and either Sn or In, or both Sn and In. More preferably, the brazing material layer 3 contains 85 parts by mass or more and 93.1 parts by mass or less of Ag, 5.0 parts by mass or more and 13 parts by mass or less of Cu, 1.5 parts by mass or more and 5.0 parts by mass or less of Ti, and 0.40 parts by mass or more and 3.5 parts by mass or less of Sn and In in total.

With the embodiment, the defects related to the brazing material oozing can be further reduced, thereby achieving the ceramic-copper composite 10 having higher reliability.

<Ceramic Layer>

The ceramic layer 1 is formed of a ceramic substrate, and a material thereof is not limited.

Examples of the material of the ceramic layer 1 can include nitride-based ceramics such as silicon nitride and aluminum nitride, oxide-based ceramics such as aluminum oxide and zirconium oxide, carbide-based ceramics such as silicon carbide, and boride-based ceramics such as lanthanum boride, and the like.

In terms of improving a bonding strength with the copper layer 2, non-oxide ceramics such as aluminum nitride and silicon nit ride are preferable. Furthermore, silicon nitride is preferable in terms of an excellent mechanical strength and fracture toughness.

<Thickness of Each Layer (Average Thickness)>

A thickness of the ceramic layer 1 is typically 0.1 mm or more and 3.0 mm or less. Considering heat radiation characteristics of the entire substrate and the reduction in thermal resistance, the thickness of the ceramic layer 1 is preferably 0.2 mm or more and 1.2 mm or less, and more preferably 0.25 mm or more and 1.0 mm or less.

A thickness of the copper layer 2 is typically 0.1 mm or more and 1.5 mm or less. In terms of a heat radiation property, the thickness of the copper layer 2 is preferably 0.3 mm or more, and more preferably 0.5 mm or more.

A thickness of the brazing material layer 3 is not limited as long as the ceramic layer 1 and the copper layer 2 can be bonded. The thickness of the brazing material layer 3 is typically 3 μm or more and 40 μm or less, preferably 4 μm or more and 25 μm or less, and more preferably 5 μm or more and 15 μm or less.

The ceramic-copper composite 10 according to the present embodiment preferably has a brazing material layer 3 in an amount of 1.0 mg or more and 15.0 mg or less, and more preferably 5.0 mg or more and 12.0 mg or less, with respect to an area of 1 cm$^2$ of a bonding portion between the ceramic layer 1 and the copper layer 2. With the embodiment, the defects related to the brazing material oozing can be further reduced, thereby achieving the ceramic-copper composite 10 having higher reliability.

<Additional Layers, and the Like>

The ceramic copper composite of the present embodiment may include additional layers other than the above-described three layers.

For example, the ceramic-copper composite of the present embodiment may have a five-layered structure in which the ceramic layer 1 is used as a center layer and copper layers are provided on both surfaces of the ceramic layer 1 through brazing material layers 3.

In a case of the five-lad structure as described above, the ceramic-copper composite has two copper layers. In this case, the ceramic-copper composite preferably satisfies Expression (1) in the cut surface of at least one of caper layers obtained when the ceramic-copper composite is cut at a plane perpendicular to the main surface thereof, and more preferably satisfies Expression (1) in the cut surface of both of two copper layers. In addition, the embodiment of S(102)+(101), S(111)+S(112), and the area ratio of each crystal orientation in the cut surface of at least one of copper layers, more preferably, in the cut surface of both of two copper layers is more preferable, in terms of further reducing the defects related to the brazing material oozing or further improving the yield.

<Shape, Size, and the Like of Composite>

As described above, the ceramic-copper composite 10 of the present embodiment has a flat plate shape.

Typically, the ceramic-copper composite 10 of the present embodiment has a substantially rectangular shape having a size of about 10 mm×10 mm to 200 mm×200 mm.

<Manufacturing Method of Ceramic-Copper Composite>

The ceramic-copper composite 10 according to the present embodiment can be produced, for example, by a manufacturing method including bonding a ceramic substrate and a copper plate with a brazing material.

More specifically, the method for producing the ceramic-copper composite 10 according to the present embodiment can be produced, for example, by the following steps.

(Step 1) A brazing material paste is applied to one or both surfaces of the ceramic plate to bring the copper plate into contact with the applied surface.

(Step 2) The ceramic plate and the copper plate are bonded by a heat treatment in a vacuum or inert atmosphere.

First, a raw material used for producing the ceramic-copper composite 10 according to the present embodiment will be described.

<Copper Plate>

As the copper plate, a rolled copper plate is preferable, and more specifically, oxygen-free copper (OFC) rolled at a large pressure is more preferable. For reference, an OFCG material (oxygen-free copper plate, produced by Mitsubishi Shindoh Co., Ltd.) is produced by a process including a rolling process.

Further, the copper plate used to manufacture the ceramic-copper composite 10 according to the present embodiment satisfies the following Expression (1) in a cut surface of the copper layer obtained by cut at a plane perpendicular to a main surface thereof, where S(102)% is an area ratio occupied by copper crystals having a crystal orientation of which an inclination from a crystal orientation of (102) plane is within 10°, S(101)% is an area ratio occupied by copper crystals having a crystal orientation of which an inclination from a crystal orientation of (101) plane is within 10°, S(111)% is an area ratio occupied by copper crystals having a crystal orientation of which an inclination from a crystal orientation of (111) plane is within 10°, and S(112)% is an area ratio occupied by copper crystals having a crystal orientation of which an inclination from a crystal orientation of (112) plane is within 10°, $$S(102)+S(101)>S(111)+S(112). \quad \text{Expression (1)}$$

By using a copper plate having a crystal orientation satisfying Expression (1) as a copper plate of a raw material, the crystal orientation of the obtained ceramic-copper composite 10 can be controlled, such that it is considered that the defects related to the brazing material oozing is reduced and the yield is improved.

The area ratio (1) of the copper crystals having each crystal or in the cut surface of the copper plate obtained by cutting it on the plane perpendicular to the main surface thereof can be measured by the same method as the area ratio (1) of the copper crystals having each crystal orientation in the cut surface of the copper layer 2 obtained when the above-described ceramic-copper composite 10 is cut at a plane perpendicular to the main surface thereof.

Further, in the copper plate used to produce the ceramic-copper composite 10 according to the present embodiment, S(102)+S(101) is preferably 2% or more, more preferably 3% or more, and still more preferably 5% or more than S(111)+S(112).

Further, S(102)+S(101) is preferably 2% or more and 50% or less, more preferably 5% or more and 40% or less, and still more preferably 10% or more and 30% or less.

By setting S(102)+S(101) within the numerical range, the crystal orientation of the obtainable ceramic-copper composite 10 can be controlled, such that it is considered that a stress relaxation capability generated during the thermal cycle test is improved, the defects related to the brazing material oozing is reduced, and the yield is improved.

S(111)+S(112) is preferably 1% or more and 30% or less, more preferably 3% or more and 25% or less, and still more preferably 5% or more and less than 20%.

By setting S(111)+S(112) within the numerical range, the crystal orientation of the obtainable ceramic-copper composite 10 can be controlled, such that it is considered that the defects related to the brazing material oozing is reduced, and the yield is improved.

For example, S(102) is preferably 1% or more and 40% or less, more preferably 2% or more and 30% or less, and still more preferably 3% or more and 25% or less.

For example, S(101) is preferably 0.1% or more and 30% or less, more preferably 0.5% or more and 20% or less, and still more preferably 1% or more and 15% or less.

For example, S(111) is preferably 0.1% or more and 25% or less, more preferably 0.5% or more and 20% or less, and still more preferably 1% or more and 10% or less.

For example, S(112) is preferably 0.1% or more and 25% or less, more preferably 0.5% or more and 20% or less, and still more preferably 1% or more and 15% or less.

By setting the area ratio of each crystal orientation within the above numerical range, it is considered that the defects related to the brazing material oozing are reduced, and the yield is improved.

As described above, by adopting the area ratio of each crystal orientation of the copper plate used for a raw material of the ceramic-copper composite 10 in the embodiment, the area ratio of each crystal orientation of the copper layer 2 in the obtainable ceramic-copper composite 10 can be controlled. In addition, a reason that the ceramic-copper composite 10 has an effect capable of decreasing the brazing material oozing in the bonding of the ceramic-copper composite 10 is assumed as follows. That is, in the bonding in the related art, the brazing material between the ceramic substrate and the copper plate oozes during the bonding to occur a defective appearance, or the oozed brazing material may further crawl up the copper plate to decrease solder wettability due to the crawled-up brazing material. In addition, a technology in which by using a burr generated in the copper plate, for example, by press working and making a side of the burr in the copper plate face the ceramic substrate, a wall is formed by the burr, and the oozing of the brazing material is thus physically decreased, is provided (for example, see Patent Document 4). However, it is difficult to form the burr over the entire periphery of the copper plate and precisely control the height of the burr over the entire periphery of the copper plate. For example, if there is a portion where the burr is partially formed or there is a portion where the height of the formed burr is relatively low, the brazing material oozes out of the portion.

Although the detailed mechanism is not clear, with the production method according to the present embodiment, for example, by adopting the area ratio of each crystal orientation of the copper plate used for a raw material of the ceramic-copper composite 10 in the embodiment, the obtained area ratio of each crystal orientation can be controlled, and in the bonding the ceramic substrate and the copper plate through the brazing material, since it is less likely to grow the copper crystal grains and the particles are not coarsened, the brazing material oozing can be decreased in the bonding.

In the present embodiment, the copper plate can contain a metal element other than Cu as an impurity. Specific examples of the metal element can include Ag and Al.

The copper plate according to the present embodiment preferably has an Ag content of 5 ppm or more and 100 ppm or less, and more preferably 7 ppm or more and 50 ppm or less.

In addition, the copper plate according to the present embodiment preferably has an Al content of 2.0 ppm or less, more preferably 1.0 ppm or less, and still more preferably 0.5 ppm or less.

A relationship between an amount of impurities contained in die copper plate and the reliability of the ceramic-copper composite 10 after the thermal cycle test is not necessarily clear. However, by setting the amount of impurities within the numerical range, it is considered that growth of the copper crystal particles can be decreased. Since the amount of the brazing material diffused into the copper layer 2 increases, it is considered that defects related to the brazing material oozing are further reduced, and the yield is further improved.

In addition, the copper plate according to the present embodiment preferably has a Mg content of 0.1 ppm or less, more preferably 0 ppm or a detection limit or less by the method described above in Examples.

The amount of impurities contained in the copper plate can be analyzed by ICP emission spectrometry as described above Specifically the amount of impurities contained in the rolled copper plate can be obtained by cutting the rolled copper plate according to the present embodiment, cleaning the cut rolled copper plate with acetone and a mixed acid of hydrochloric acid and nitric acid, adding 5 ml of nitric acid to 1 g of the cleaned sample, and dissolving the mixture at a sand bath to measure the obtained solution using an ICP emission spectrometer (ICPE-9000, manufactured by Shimadzu Corporation).

The copper plate according to the present embodiment may be a copper plate having a first surface facing the ceramic layer 1 and a second surface opposite to the first surface, and having a burr that protrudes toward the ceramic layer 1 on a part or the entire periphery of an outer edge portion of the first surface.

The rolled copper plate having a protruded burr on a part or the entire periphery of the outer edge portion can be obtained by, for example, blanking by press working.

The surface of the copper plate having a burr generated by blanking by press working is formed as the surface facing the ceramic layer 1 to form the wall by the burr, such that the oozing of the brazing material can be physically decreased.

In addition, the copper plate according to the present embodiment may be a copper plate that has a portion without the burr that protrudes toward the ceramic layer 1 on a part of the outer edge portion of the first surface, or has the burr that protrudes toward the ceramic layer 1 and have a height of 20 or less on a part of the outer edge portion of the first surface (FIG. 4). That is, according to the present embodiment, even when the copper plate to be used is a copper plate having a burr generated by blanking by press working and the burr is not formed over the entire periphery of the copper plate (or portion where the burr is not formed on a part thereof) or a portion where the height of the formed burr is relatively low is present, the brazing material oozing can be decreased in the bonding by adopting the area ratio of each crystal orientation in the copper plate.

<Ceramic Substrate>

The description of the ceramic substrate according to the present embodiment is the same as the ceramic layer 1, and a material thereof is not limited.

Examples of the ceramic substrate can include nitride-based ceramic substrates such as a silicon nitride substrate and an aluminum nitride substrate, oxide-based ceramic substrates such as an aluminum oxide substrate and a zirconium oxide substrate, a carbide-based ceramic substrate such as a silicon carbide substrate, and a boride-based ceramic substrate such as a lanthanum boride substrate, and the like.

In terms of improving a bonding strength with the copper plate, non-oxide ceramic substrates such as an aluminum, nitride substrate and a silicon nitride substrate are preferable. Furthermore, a silicon nitride substrate is preferable in terms of an excellent mechanical strength and fracture toughness.

<Brazing Material>

In terms of improving the thermal cycle characteristics, the brazing material according to the present embodiment preferably contains Ag, Cu and Ti, and either Sn or In, or both Sn and In.

More preferably, the brazing material contains 85 parts by mass or more and 93.1 parts by mass or less of Ag, 5.0 parts by mass or more and 13 parts by mass or less of Cu, 1.5 parts by mass or more and 5.0 parts by mass or less of Ti, and 0.40 parts by mass or more and 3.5 parts by mass or less of Sn and In in total.

With the embodiment, the ceramic-copper composite 10 having higher reliability can be achieved.

It is also important to use the brazing material having an appropriate composition of type and amount in blending, in terms of controlling the area ratio of each obtained crystal orientation within the above numerical range.

Ag powder having a specific surface area of 0.1 $m^2/g$ or more and 0.5 $m^2/g$ or less may be used as Ag described above. By using the Ag powder having an appropriate specific surface area, it is possible to sufficiently decrease aggregation of the powder, bonding defects, formation of bonding voids, or the like. A gas adsorption method can be applied to measurement of the specific surface area.

The Ag powder is generally prepared by an atomizing method, a wet reduction method, or the like.

Further, the median diameter D50 of the Ag powder can be, for example, 0.5 μm or more and 8 μm or less.

As Cu described above, Cu powder having a specific surface area of 0.1 $m^2/g$ or more and 1.0 $m^2/g$ or less and a median diameter D50 of 0.8 μm or more and 8.0 μm or less in a particle size distribution on a volume basis measured by a laser diffraction method, may be used, in order to make the Ag-rich phases continuous. By using the Cu powder with the appropriate specific surface area or grain size, it is possible to decrease the bonding defects and decrease the Ag-rich phases from being discontinuous due to the Cu-rich phase.

Sn or In contained in the brazing material is a component for reducing a contact angle of the brazing material with respect to the ceramic plate and improving wettability of the brazing material. The blending amount thereof is preferably 0.40 parts by mass or more and 3.5 parts by mass or less.

By appropriately adjusting the blending amount, the wettability no the ceramic plate can be made appropriate and the possibility of bonding defects can be reduced. In addition, the possibility of the Ag-rich phases in the brazing material layer 3 being discontinuous due to the Cu-rich phase, resulting an origin of cracking of the brazing material, and thermal cycle characteristics being reduced can be reduced.

As Sn or In described above, Sn powder or In powder having a specific surface area of 0.1 $m^2/g$ or more and 1.0 $m^2/g$ or less and D50 of 0.8 μm or more and 10.0 μm or less may be used.

By using powder with the appropriate specific surface area or grain size, it is possible to reduce the possibility of bonding defects or the possibility of occurrence of bonding voids.

D50 of the metal powder can be measured with, for example, a laser diffraction/scattering particle size distribution analyzer.

In addition, the specific surface area of the metal powder can be measured with, for example, a BET specific surface area measuring instrument.

The brazing material preferably contains an active metal in terms of enhancing reactivity with an aluminum nitride substrate or a silicon nitride substrate. Specifically, it is preferable to contain titanium because it can have high reactivity with the aluminum nitride substrate or the silicon nitride substrate and a very high bonding strength.

An addition amount of the active metal such as titanium is preferably 1.5 parts by mass or more and 5.0 parts by mass or less, with respect to the total of 100 parts by mass of the Ag powder, the Cu powder, and the Sn powder or the In powder. By appropriately adjusting the addition amount of the active metal, the wettability to the ceramic plate can be further enhanced, and the occurrence of bonding defects can be further decreased. In addition, the unreacted active metal can be decreased to remain, and discontinuity of the Ag-rich phases can also be decreased.

The brazing material can be obtained by mixing at least the above-described metal powder with an organic solvent or a binder, if necessary. For mixing, an automated mortar, a revolving mixer, a planetary centrifugal mixer, a triple roller, or the like can be used. As a result, a paste-like brazing material can be obtained, for example.

The organic solvent that is available here is not limited. Examples of the organic solvent can include methyl cellosolve, ethyl cellosolve, isophorone, toluene, ethyl acetate, telepineol(terpineol), diethylene glycol monobutyl ether, and texanol.

The binder that is available here is not limited. Examples of the binder can include a polymer compound such as polyisobutyl methacrylate, ethyl cellulose, methyl cellulose, an acrylic resin, and a methacrylic resin.

<Brazing Material Paste Applying Step>

A method of applying a brazing material paste to the ceramic plate in (Step 1) is not limited. Examples of the method of applying the brazing material paste can include a roll coater method, a screen printing method, a transfer method, and the like. The screen printing method is preferable because it is easy to uniformly apply the brazing material paste.

In order to uniformly apply the brazing material paste by the screen printing method, a viscosity of the brazing material paste is preferably controlled to 5 Pa·s or more and 20 Pa·s or less. In addition, an amount of the organic solvent in the brazing material paste is adjusted to 5% by mass or more and 17% by mass or less and an amount of the binder is adjusted to 2% by mass or more and 8% by mass or less, such that printability can be enhanced.

An application amount of the brazing material can be, for example, 1.0 $mg/cm^2$ or more and 15.0 $mg/cm^2$ or less, and preferably 5.0 $mg/cm^2$ or more and 12.0 mg/cm or less.

By setting the application amount within the numerical range, the crystal orientation of copper can be more appropriately controlled, such that it is considered that the defects related to the brazing material oozing are further reduced, and the yield is further improved.

<Bonding Step>

A treatment of the bonding of the ceramic plate and the copper plate in (Step 2) is preferably performed under vacuums or inert atmosphere such as nitrogen or argon at a temperature of 770° C. or higher and 830° C. or lower for 10 minutes or longer and 60 minutes.

When the temperature is 770° C. or higher, when the treatment time is 10 minutes or longer, or when the temperature is 770° C. or higher and the treatment time is 10 minutes or longer, an amount of copper dissolved from the copper plate can be sufficiently increased and bondability of the ceramic plate and the copper plate can be sufficiently strengthened.

On the other hand, when the temperature is 830° C. or lower, when the treatment time is 60 minutes or shorter, or when the temperature is 830° C. or lower and the treatment time is 60 minutes or shorter, merits, such as the area ratio of each crystal orientation in the cut surface of the copper layer 2 of the obtained ceramic-copper composite 10 being controlled within the above numerical range mentioned, continuity of the Ag-rich phases in the brazing material layer 3 being easily maintained, excessive diffusion of the brazing material into the copper plate being decreased, coarsening of the copper crystal due to recrystallization of copper being decreased, the brazing material oozing being decreased, and a stress caused by a difference in coefficient of thermal expansion between ceramic and copper being reduced, can be obtained.

The composite (including the ceramic layer 1, the copper layer 2, and the brazing material layer 3 present between these two layers) of the present embodiment can be obtained by the steps like (Step 1) and (Step 2).

<Ceramic Circuit Board>

The obtained ceramic-copper composite 10 may be further treated/processed.

For example, at least a part of the copper layer 2 of the ceramic-copper composite 10 may be removed to form a circuit. More specifically, a circuit pattern may be formed by removing a part of the copper layer 2 or the brazing material layer 3 by etching. As a result, a ceramic circuit board can be obtained.

A procedure for forming the circuit pattern on the composite to obtain a ceramic circuit board will be described below.

Formation of Etching Mask

First, an etching mask is formed on a surface of the copper layer 2.

As a method of forming the etching mask, a known technology, such as a photographic development method (photoresist method), a screen printing method, or an inkjet printing method using PER400K ink (produced by Goo Chemical Co., Ltd.), can be appropriately adopted.

Etching Treatment of Copper Layer 2

In order to form the circuit pattern, an etching treatment is performed on the copper layer 2.

There is no limitation on an etching solution. As the etching solution generally used, a ferric chloride solution, a cupric chloride solution, sulfuric acid, a hydrogen peroxide solution, or the like can be used. Preferred examples thereof can include a ferric chloride solution or a cupric chloride solution. A side surface of a copper circuit may be tilted by adjusting an etching time.

Etching Treatment of Brazing Material Layer 3

The applied brazing material, an alloy layer thereof, a nitride layer, and the like remain in the composite from which a part of the copper layer 2 is removed by etching, so it is common to remove them by using a solution containing an aqueous solution of ammonium halide, inorganic acids such as sulfuric acid and nitric acid, or a hydrogel peroxide solution. By adjusting conditions such as an etching time, a temperature, and a spray pressure, a length and a thickness of the protruding portion of the brazing material can be adjusted.

Peeling of Etching Mask

A method of peeling the etching mask after the etching treatment is not limited. A method of immersing the etching mask in an alkaline aqueous solution is generally used.

Plating/Rustproofing Treatment

In terms of improving durability, decreasing changes over time, or the like, a plating treatment or a rustproofing treatment may be performed.

Examples of the plating can include Ni plating, Ni alloy plating, Au plating, and the like. A specific method of plating can be performed by, for example, (i) a normal electroless plating method of using a liquid chemical containing a hypophosphorous acid salt as a Ni—P electroless plating liquid after degreasing, chemical polishing, and a pretreatment step with a liquid chemical for Pd activation, and (ii) a method of electroplating by bringing an electrode into contact with a copper circuit pattern.

The rustproofing treatment can be performed by, for example, a benzotriazole-based compound.

<Power Module>

A power module on which the ceramic circuit board is mounted can be obtained by disposing an appropriate semiconductor element on the ceramic circuit board in which the copper circuit is formed as described above, for example.

For specific configurations and details of the power module, see, for example, Patent Documents 1 to 3 described above, Japanese Unexamined Patent Publication No. H10-223809, Japanese Unexamined Patent Publication No. H10-214915, and the like.

Although the embodiments of the present invention have been described above, these are mere examples of the present invention, and various other configurations other than those given above may be adopted. Further, the present invention is not limited to the above-described embodiments, and modifications, improvements, and the like within the range in which the object of the present invention can be achieved are included in the present invention.

EXAMPLES

Embodiments of the present invention will be described in detail based on Examples and Comparative Examples. The present invention is not limited to Examples.

Preparation of Ceramic-Copper Composite

Example 1

As a brazing material (containing active metal), a brazing material containing 3.5 parts by mass of titanium hydride powder (TCH-100, produced by TOHO TECHNICAL SERVICE) was prepared with respect to a total of 100 parts by mass of 89.5 parts by mass of Ag powder (Ag-HWQ produced by FUKUDA METAL FOIL & POWDER CO., LTD., median diameter D50: 2.5 µm, specific surface area: 0.4 m$^2$/g), 9.5 parts by mass of Cu powder (Cu-HWQ produced by FUKUDA METAL FOIL & POWDER CO., LTD., median diameter D50: 3 µm, specific surface area: 0.3 m$^2$/g), and 1.0 part by mass of tin powder (Sn-HPN produced by FUKUDA METAL FOIL & POWDER CO., LTD., median diameter D50: 3 µm, specific surface area: 0.3 m$^2$/g).

Here, D50 of the metal powder was measured with a laser diffraction/scattering particle size distribution analyzer. In addition, the specific surface area of the metal powder was measured with a BET specific surface area measuring instrument.

The brazing material, a binder resin PIBMA (polyisobutyl methacrylate, "DIANAL" produced by Mitsubishi Chemical Corporation) and a terpineol solvent were mixed to obtain a brazing material paste. The addition amount of the binder was 8 parts by mass or less with respect to 100 parts by mass in total of the Ag powder, the Cu powder, the Sn powder, and titanium hydride powder.

The brazing material paste was applied to both surfaces of a silicon nitride substrate by a screen printing method so that a dry thickness on each surface was about 10 μm, and the application amount of the brazing material paste after drying (after removing the solvent) was 8.0 mg/cm². As the silicon nitride substrate, a substrate (manufactured by Denka Company Limited) having a thickness of 0.32 mm and a size of 45 mm in length×45 mm in width was used.

Thereafter, a copper plate 1-1 was stacked on both surfaces of the silicon nitride substrate, and heated in vacuum of $1.0 \times 10^{-3}$ Pa. or less at 780° C. for 30 minutes, and the silicon nitride substrate and the copper plate were bonded with the brazing material. As a result, a ceramic-copper composite in which the silicon nitride substrate and the copper plate were bonded with the brazing material was obtained.

An etching resist was printed on the bonded copper plate and etched with a ferric chloride solution to form a circuit pattern. Further, the brazing material layer and the nitride layer were removed with an ammonium fluoride/hydrogen peroxide solution. In a plating step, the rustproofing treatment was performed with the benzotriazole-based compound through the pretreatment step by degreasing and chemical polishing.

As a result, a ceramic circuit board was obtained in which a part of the copper layer of the ceramic-copper composite was removed and a circuit was formed.

Examples 2 to 6 and Comparative Examples 1 to 3

The silicon nitride substrate and the copper plate were bonded with the brazing material to obtain a ceramic-copper composite in the same manner as in Example 1, except that a copper plate shown in Table 1 was used as the copper plate and a composition and a blending amount of the brazing material paste were respectively as shown in Table 2. Then, the etching treatment or the like was performed to obtain a ceramic circuit board.

TABLE 1

| | | Raw material copper plate | | | | | | | | | | | | |
|---|---|---|---|---|---|---|---|---|---|---|---|---|---|---|
| | | Area ratio of plane having each crystal orientation | | | | | | | | | | | | |
| Example/ Comparative Example No. | Copper Plate No. | (102) Plane % | (101) Plane % | Sum of (101) plane and (102) Plane % | (111) Plane % | (112) Plane % | Sum of (111) plane and (112) plane % | Amount of impurities | | | | | | |
| | | | | | | | | Ag ppm | Al ppm | Ca ppm | Fe ppm | Mg ppm | Ni ppm | Zn ppm |
| Example 1 | Copper Plate 1-1 | 15.4 | 8.9 | 24.3 | 3.1 | 11.7 | 14.8 | 9.7 | ND | ND | ND | ND | ND | ND |
| Example 2 | Copper Plate 1-2 | 13.8 | 9.4 | 23.2 | 2.9 | 14.1 | 17.0 | 9.5 | ND | ND | ND | ND | ND | ND |
| Example 3 | Copper Plate 1-3 | 14.2 | 8.5 | 22.7 | 3.5 | 12.5 | 16.1 | 9.5 | ND | ND | ND | ND | ND | ND |
| Example 4 | Copper Plate 2-1 | 10.7 | 2.3 | 13.0 | 1.3 | 7.4 | 8.7 | 9.4 | ND | ND | ND | ND | ND | ND |
| Example 5 | Copper Plate 2-2 | 12.1 | 1.2 | 13.3 | 1.5 | 5.4 | 8.0 | 9.5 | ND | ND | ND | ND | ND | ND |
| Example 6 | Copper Plate 2-3 | 11.5 | 1.7 | 13.2 | 1.5 | 3.2 | 9.7 | 9.5 | ND | ND | ND | ND | ND | ND |
| Comparative Example 1 | Copper Plate 3-1 | 3.7 | 0.7 | 4.4 | 10.0 | 20.0 | 30.0 | 12.0 | 3.9 | ND | ND | ND | ND | ND |
| Comparative Example 2 | Copper Plate 4-1 | 3.2 | 0.5 | 3.7 | 10.4 | 20.9 | 31.3 | 10.0 | 8.2 | ND | ND | 0.3 | ND | ND |
| Comparative Example 3 | Copper Plate 4-2 | 4.4 | 0.7 | 5.1 | 11.3 | 16.5 | 27.3 | 9.5 | 8.1 | ND | ND | 0.2 | ND | ND |

TABLE 2

| | Manufacturing condition of ceramic-copper composite | | | | | | |
|---|---|---|---|---|---|---|---|
| | Brazing Material | | | | | Bonding | |
| | Blending | | | | | | |
| Example/ Comparative Example No. | Ag Parts by mass | Cu Parts by mass | Sn Parts by mass | TiH Parts by mass | Application amount mg/cm² | Bonding temperature ° C. | Bonding time min |
| Example 1 | 89.5 | 9.5 | 1.0 | 3.5 | 8.0 | 780 | 50 |
| Example 2 | 88.0 | 9.0 | 3.0 | 3.5 | 6.0 | 790 | 45 |
| Example 3 | 88.0 | 9.0 | 3.0 | 3.5 | 12.0 | 800 | 45 |
| Example 4 | 88.0 | 9.0 | 3.0 | 3.5 | 10.0 | 810 | 30 |
| Example 5 | 88.0 | 9.0 | 3.0 | 3.5 | 8.0 | 800 | 20 |
| Example 6 | 88.0 | 8.0 | 9.0 | 3.0 | 3.5 | 790 | 50 |
| Comparative Example 1 | 80.0 | 8.0 | 12.0 | 3.5 | 13.0 | 840 | 90 |
| Comparative Example 2 | 80.0 | 8.0 | 12.0 | 3.5 | 13.0 | 840 | 110 |
| Comparative Example 3 | 80.0 | 8.0 | 12.0 | 3.5 | 13.0 | 850 | 120 |

In Table 1, copper plates 1-1 to 4-2 are as follows. The grain size of the copper crystals in all the copper plates was about 20 μm. In addition, all the copper plates had a protruded burr on the surface facing the ceramic layer.

Copper plate 1-1: OFCG-Ver. 2-1-1 (oxygen-free copper grain control, abbreviation of OFCG) produced by Mitsubishi Shindoh Co., Ltd., a rolled copper plate having a thickness of 0.8 mm Copper plate 1-2: OFCG-Ver. 2-1-2 (oxygen-free copper grain control, abbreviation of OFCG) produced by Mitsubishi Shindoh Co., Ltd., a rolled copper plate having a thickness of 0.8 mm Copper plate 1-3: OFCG-Ver. 2-1-3 (oxygen-free copper grain control, abbreviation of OFCG) produced by Mitsubishi Shindoh Co., Ltd., a rolled copper plate having a thickness of 0.8 mm Copper plate 2-1: OFCG-Ver. 2-2-1 (oxygen-free copper grain control, abbreviation of OFCG) produced by Mitsubishi Shindoh Co., Ltd., a rolled copper plate having a thickness of 0.8 mm Copper plate 2-2: OFCG-Ver. 2-2-2 (oxygen-free copper grain control, abbreviation of OFCG) produced by Mitsubishi Shindoh Co., Ltd., a rolled copper plate having a thickness of 0.8 mm Copper plate 2-3: OFCG-Ver. 2-2-3 (oxygen-free copper grain control, abbreviation of OFCG) produced by Mitsubishi Shindoh Co., Ltd., a rolled copper plate having a thickness of 0.8 mm Copper plate 3-1: OFCG-Ver. 2-3-1 (oxygen-free copper grain control, abbreviation of OFCG) produced by Mitsubishi Shindoh Co., Ltd., a rolled copper plate having a thickness of 0.8 mm Copper plate 4-1: an oxygen-free copper (abbreviation of OFC) –1, produced by Mitsubishi Shindoh Co., Ltd., a thickness of 0.8 mm Copper plate 4-2: an oxygen-free copper (abbreviation of OFC) –2, produced by Mitsubishi Shindoh Co., Ltd., a thickness of 0.8 mm <Evaluation of Copper Plate Used as Raw Material>

In Examples and Comparative Examples, the copper plate used as a raw material was evaluated by the following method.

(Calculation of Area Ratio (%) of Copper Crystals Having Each Crystal Orientation)

The area ratio (%) of the copper crystals having each crystal orientation of the raw material copper plate was calculated by the following method.

First, a "cross section" for measurement was obtained by the following procedure.

(i) The raw material copper plate was cut at a cross section perpendicular to a rolling direction of the copper plate and the main surface thereof and passing through the center of gravity of the copper plate. A contour machine was used for cutting.

(ii) The cut copper plate was embedded in a resin to prepare a resin-embedded body.

(iii) Buff polishing was performed on the cross section of the copper plate in the prepared resin-embedded body with diamond abrasive grains.

(iv) The polished surface of the copper plate was subjected to a flat milling treatment by Ar milling.

An analysis of the obtained cross section of the copper plate was performed by an electron backscatter diffraction method in the same manner as an evaluation method of the ceramic-copper composite to be described later. When an area of the analyzed region was 100%, an area ratio (%) occupied by the copper crystals having each crystal orientation was obtained. The results are shown in Table 1.

(Analysis of Amount of Impurities)

An amount of impurities for the copper plates used in each of the above Examples and Comparative Examples was analyzed by an ICP emission spectrometry. The copper plate used in respective Examples and Comparative Examples was cut out and cleaned with acetone and a mixed acid of hydrochloric acid and nitric acid, 5 ml of nitric acid was added to 1 g of the cleaned sample, and the mixture was dissolved at a sand bath to measure the obtained solution using an ICP emission spectrometer (ICPE-9000, manufactured by Shimadzu Corporation). The results are shown in Table 1.

<Evaluation of Ceramic-Copper Composite>

The obtained ceramic-copper composites of the Examples and Comparative Examples were evaluated by the following methods.

(Calculation of Area Ratio (%) of Copper Crystals Having Each Crystal Orientation)

An area ratio (%) of the copper crystals having each crystal orientation of the ceramic-copper composite was calculated by the following method.

First, a "cross section" for measurement was obtained by the following procedure.

(i) The ceramic circuit board obtained in respective Examples and Comparative Examples was cut at a cross section perpendicular to the rolling direction of the copper plate and the main surface and passing through the center of gravity of the substrate (approximately the center of the silicon nitride substrate having 45 mm in length and 45 mm in width). A contour machine was used for cutting.

(ii) The cut ceramic circuit board was embedded in a resin to prepare a resin-embedded body.

Buff polishing was performed on a cross section of the ceramic circuit board in the prepared resin-embedded body with diamond abrasive grains.

(iv) The polished surface of the ceramic circuit board was subjected to a flat milling treatment by Ar milling.

The polished cross section of the copper layer was measured by the electron backscatter diffraction method.

Specifically, first, a field of view of 800×300 μm was set in the vicinity of approximately the center of the polished cross section of the copper layer. The copper layer in the field of view was analyzed by an electron backscatter diffraction (EBSD) method under a condition of an acceleration voltage of 15 kV to acquire data. A SU6600 type field-emission scanning electron microscopy (manufactured by Hitachi High-Tech Corporation) and an EBSD (manufactured by TSL Solutions) were used in the EBSD method.

The measurement data was visualized by software (OIM Data Analysis 7.3.0, manufactured by TSL Solutions) to create a crystal orientation map in which a color of the copper crystal grains was divided by the crystal orientation of the copper crystals. By analyzing the crystal orientation map with the image processing software, when an area of the analyzed region was 100%, the area ratio (%) occupied by copper crystals having each crystal orientation was obtained.

(Average Crystal Grain Size of Copper Crystals Measured Intercept Method)

An average crystal grain size of the copper crystals present in region A of FIG. 1A was measured by an intercept method when observed from an upper surface of the copper layer of the ceramic-copper composite obtained in respective Examples and Comparative Examples.

The ceramic-copper composites obtained in Examples and Comparative Examples were cut out using a contour machine, set on a sample table so that the second surface 5 faces upside, and an analysis was performed by an electron backscatter diffraction (EBSD) method at an acceleration voltage of 15 kV in an observation field of view with the 50 times magnification, thereby creating a crystal orientation map in which a color of the copper crystal grains was divided by the same manner as the calculation of the area ratio (%) of the copper crystals. By analyzing the crystal orientation map using image processing software, the average crystal grain size of the copper crystal was obtained.

As the image processing software, Image-Pro Plus Shape Stack version 6.3 (manufactured by Media Cybernetics, Inc.) was used. The average crystal grain size was calculated by using the intercept method, and by drawing 10 straight lines having a predetermined length on one observed image in parallel, an average value of a length of a part of the straight lines crossing the copper crystal particles was obtained as an average crystal grain size of the copper crystals.

(Evaluation of Brazing Material Oozing)

Brazing material oozing for the ceramic-copper composites in the respective Examples and Comparative Examples were evaluated by the following methods. The brazing material oozing means a phenomenon in which a brazing material (usually, silver) used for bonding ceramic and a copper plate protrudes from an end portion of the copper plate, crawls up an end surface 6 of the copper layer, and is wrapped around the surface of the copperplate (second surface 5).

First, the obtained ceramic-copper composite was immersed in a mixed solution (roughing solution) of sulfuric acid and a hydrogen peroxide solution, and the surface of the copper plate was etched by about 0.5 µm to roughen the etched surface of the copper plate.

Figure 3:
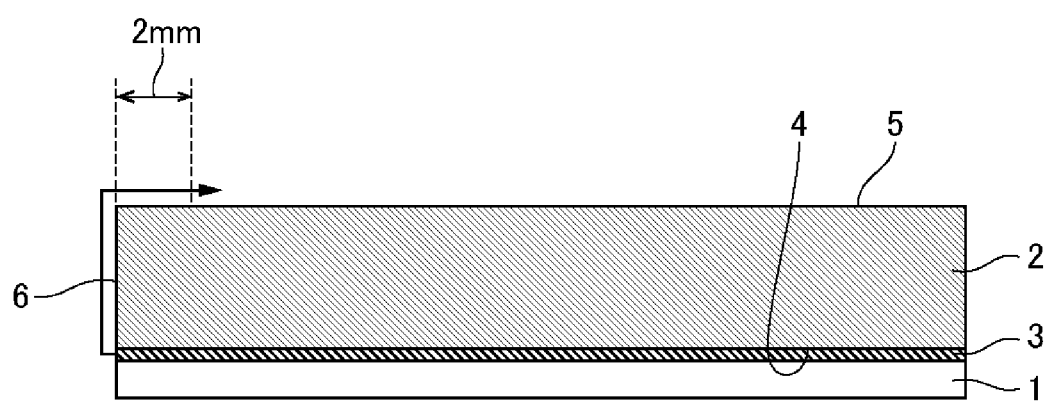
FIG. 3 is a cross-sectional view illustrating brazing material oozing.

An appearance of the roughened surface of the copper layer (second surface 5) of the ceramic-copper composite was observed, and it was determined that brazing material oozing occurs (see FIG. 3) when the brazing material crept up the end surface 6 of the copper layer and was wrapped around the surface of the copper layer (second surface 5), the wrapped brazing material spread from the end portion of the copper layer toward the center of the copper layer on the surface of the copper layer (second surface 5), and there was a portion in which the brazing material spread over a portion 2 mm away from the end portion of the surface of the copper layer (second surface 5). The occurrence of oozing was confirmed for N=100 ceramic-copper composites, and the determination was made according to the following criteria:

O: As a result of observing the appearance of N=100 ceramic-copper composites, no brazing material oozing occurred.

x: As a result of observing the appearance of N=100 ceramic-copper composites, brazing material oozing occurred.

Table 3 shows a summary of analysis results, evaluation results, or the like.

TABLE 3

| Example/Comparative Example No. | Ceramic-copper composite | | | | | | | | | | | |
|---|---|---|---|---|---|---|---|---|---|---|---|---|
| | Area ratio of plane having each crystal orientation | | | | | | | | | | | |
| | (001) Plane % | (102) Plane % | (101) Plane % | Sum of (101) plane and (102) Plane % | (111) Plane % | (112) Plane % | Sum of (111) plane and (112) plane % | (212) Plane % | (213) Plane % | Average Crystal Grain Size µm | Number of oozing N = 100 | Determination o or x |
| Example 1 | 7.4 | 17.5 | 5.6 | 23.1 | 1.8 | 7.6 | 9.4 | 15.0 | 18.0 | 173.0 | 0/100 | o |
| Example 2 | 7.8 | 19.1 | 5.2 | 24.3 | 1.2 | 8.1 | 9.3 | 13.2 | 19.2 | 162.0 | 0/100 | o |
| Example 3 | 6.5 | 10.3 | 7.5 | 25.8 | 1.5 | 7.3 | 8.8 | 14.0 | 17.5 | 130.0 | 0/100 | o |
| Example 4 | 5.3 | 8.5 | 14.1 | 22.6 | 9.2 | 4.9 | 14.1 | 10.4 | 22.3 | 198.0 | 0/100 | o |
| Example 5 | 6.2 | 9.0 | 15.0 | 24.0 | 7.5 | 4.5 | 12.0 | 12.0 | 21.6 | 182.0 | 0/100 | o |
| Example 6 | 4.8 | 9.5 | 15.6 | 25.1 | 5.3 | 5.3 | 10.6 | 15.4 | 24.2 | 187.0 | 0/100 | o |
| Comparative Example 1 | 27.4 | 0.1 | 0.0 | 0.1 | 25.0 | 12.2 | 37.2 | 13.2 | 5.2 | 379.0 | 5/100 | x |
| Comparative Example 2 | 4.7 | 0.6 | 0.0 | 0.6 | 2.4 | 47.8 | 50.2 | 22.1 | 5.2 | 492.0 | 7/100 | x |
| Comparative Example 3 | 7.3 | 1.3 | 0.0 | 1.3 | 26.0 | 1.0 | 27.0 | 52.8 | 0.1 | 615.0 | 9/100 | x |

As shown in Table 3, in the ceramic-copper composites in Examples in which S(102)+S(101)>S(111)+S(112) was satisfied in the cut surface of the copper layer obtained when the ceramic-copper composite was cut at a plane perpendicular to the main surface of the ceramic-copper composite, the occurrence of brazing material oozing was decreased.

On the other hand, in the ceramic-copper composites in Comparative Examples in which S(102)+S(101)<S(111)+S(112) was satisfied in the cut surface of the copper layer obtained when the ceramic-copper composite was cut at a plane perpendicular to the main surface of the ceramic-copper composite, it was observed that the brazing material oozing occurred.

Priority is claimed on Japanese Patent Application No. 2018-248175, filed Dec. 28, 2018, the content of which is incorporated herein by reference.

The invention claimed is:

1. A ceramic-copper composite having a flat plate shape, comprising: a ceramic layer; a copper layer; and a brazing material layer present between the ceramic layer and the copper layer, wherein the following Expression (1) is satisfied in a cut surface of the copper layer obtained when the ceramic-copper composite is cut at a plane perpendicular to a main surface of the ceramic-copper composite, where S(102)% is an area ratio occupied by copper crystals having a crystal orientation of which an inclination from a crystal orientation of (102) plane is within 10°, S(101)% is an area ratio occupied by copper crystals having a crystal orientation of which an inclination from a crystal orientation of (101) plane is within 10°, S(111)% is an area ratio occupied by copper crystals having a crystal orientation of which an inclination from a crystal orientation of (111) plane is within 10°, and S(112)% is an area ratio occupied by copper crystals having a crystal orientation of which an inclination from a crystal orientation of (112) plane is within 10°, Expression (1) S(102)+S(101)>S(111)+S(112), wherein the ceramic layer and the copper layer are bonded by the brazing material layer, wherein the copper layer is formed of a rolled copper plate having a first surface facing the ceramic layer and a second surface opposite to the first surface, wherein the brazing material layer includes Ag, Cu and Ti, and either Sn or In, or both Sn and In, and wherein the brazing material layer includes 1.5 parts by mass or more and 5.0 parts by mass or less of Ti, and wherein in the second surface, an average crystal grain size of the copper crystals measured by an intercept method is 250 μm or less.

2. The ceramic-copper composite according to claim 1, wherein the rolled copper plate has an Ag content of 5 ppm or more and 100 ppm or less.

3. The ceramic-copper composite according to claim 1, wherein the rolled copper plate has an Al content of 2.0 ppm or less.

4. The ceramic-copper composite according to claim 1, wherein the rolled copper plate has a burr that protrudes toward the ceramic layer on a part or an entire periphery of an outer edge portion of the first surface.

5. The ceramic-copper composite according to claim 4, wherein the rolled copper plate has a portion without the burr that protrudes toward the ceramic layer on a part of the outer edge portion of the first surface, or has the burr that protrudes toward the ceramic layer and have a height of 20 μm or less on a part of the outer edge portion of the first surface.

6. The ceramic-copper composite according to claim 1, wherein the brazing material layer includes 85 parts by mass or more and 93.1 parts by mass or less of Ag, 5.0 parts by mass or more and 13 parts by mass or less of Cu, and 0.40 parts by mass or more and 3.5 parts by mass or less of Sn and In in total.

7. The ceramic-copper composite according to claim 1, wherein the ceramic-copper composite has the brazing material layer of 1.0 mg or more and 15.0 mg or less with respect to an area of 1 cm² of a bonding portion between the ceramic layer and the copper layer.

8. A ceramic circuit board in which at least a part of the copper layer is removed from the ceramic-copper composite according to claim 1 and a circuit is formed.

9. A power module on which the ceramic circuit board according to claim 8 is mounted.

10. A method of producing a ceramic-copper composite, comprising: bonding a ceramic substrate and a copper plate thorough a brazing material that forms a brazing material layer, wherein the copper plate satisfies the following Expression (1) in a cut surface obtained by cutting the ceramic-copper composite at a plane perpendicular to a main surface of the ceramic-copper composite, where S(102)% is an area ratio occupied by copper crystals having a crystal orientation of which an inclination from a crystal orientation of (102) plane is within 10°, S(101)% is an area ratio occupied by copper crystals having a crystal orientation of which an inclination from a crystal orientation of (101) plane is within 10°, S(111)% is an area ratio occupied by copper crystals having a crystal orientation of which an inclination from a crystal orientation of (111) plane is within 10°, and S(112)% is an area ratio occupied by copper crystals having a crystal orientation of which an inclination from a crystal orientation of (112) plane is within 10°, Expression (1) S(102)+S(101)>S(111)+S(112), wherein the ceramic layer and the copper layer are bonded by the brazing material layer, wherein the copper layer is formed of a rolled copper plate having a first surface facing the ceramic layer and a second surface opposite to the first surface, wherein the brazing material layer includes Ag, Cu and Ti, and either Sn or In, or both Sn and In, and wherein the brazing material layer includes 1.5 parts by mass or more and 5.0 parts by mass or less of Ti, and wherein in the second surface, an average crystal grain size of the copper crystals measured by an intercept method is 250 μm or less.

11. The method of producing a ceramic-copper composite according to claim 10, wherein the bonding includes bonding the ceramic substrate and the copper plate through the brazing material by heating at a temperature of 770° C. or higher and 830° C. or lower for 10 minutes or longer and 60 minutes or shorter under vacuum or an inert gas atmosphere.

* * * * *